United States Patent [19]

Ooi

[11] Patent Number: 4,574,297
[45] Date of Patent: Mar. 4, 1986

[54] ENCAPSULATED SEMICONDUCTOR WITH TERMINALS HAVING TABS TO INCREASE SOLDER WETTING

[75] Inventor: Shiro Ooi, Kyoto, Japan
[73] Assignee: Rohm Company Limited, Kyoto, Japan
[21] Appl. No.: 573,118
[22] Filed: Jan. 23, 1984

Related U.S. Application Data

[63] Continuation of Ser. No. 283,730, Jul. 15, 1981, abandoned.
[51] Int. Cl.[4] ..................... H01L 23/28; H01L 23/48; H05K 3/34
[52] U.S. Cl. ........................................ 357/68; 357/70; 357/72; 361/403; 361/405
[58] Field of Search ............................ 357/68, 70, 72; 361/400, 403, 405

[56] References Cited

U.S. PATENT DOCUMENTS

| | | | |
|---|---|---|---|
| 3,566,003 | 2/1971 | Wislocky | 357/72 |
| 4,079,511 | 3/1978 | Grabbe | 357/72 |
| 4,278,991 | 7/1981 | Ritchie et al. | 357/70 |

FOREIGN PATENT DOCUMENTS 55-153362  11/1980  Japan ..................... 357/68

Primary Examiner—William D. Larkins
Assistant Examiner—John Lamont
Attorney, Agent, or Firm—Christensen, O'Connor, Johnson & Kindness

[57] ABSTRACT

A semiconductor device encapsulated within a plastic housing facilitates attachment to a circuit board when a dip soldering process is used. Terminal leads from the semiconductor device extend outwardly through the walls of the housing and are arranged to provide a wetting surface for solder when a semiconductor device that is attached to a circuit board is immersed in a molten solder bath. In one embodiment of the invention, the terminal leads extend upwardly from adjacent the side walls of the housing to a location substantially adjacent the top surface of the housing. When the semiconductor device and circuit board are inverted to immerse the semiconductor device into the solder, the terminal lead acts as a wetting surface to allow solder to flow to the location at which the terminal abuts the circuit board. In another embodiment, the terminal leads extend along the side walls of the housing to a location adjacent the end walls of the housing. This embodiment also permits the terminal to act as a wetting surface for solder when the semiconductor device is inverted and immersed into a solder bath.

5 Claims, 6 Drawing Figures

ENCAPSULATED SEMICONDUCTOR WITH TERMINALS HAVING TABS TO INCREASE SOLDER WETTING

This is a continuation of the prior application Ser. No. 283,730, filed July 15, 1981, the benefit of the filing date of which is hereby claimed under 35 USC 120, now abandoned.

BACKGROUND OF THE INVENTION

This invention relates to a semiconductor device such as a diode, a transistor and an integrated circuit, and more particularly to a semiconductor device encapsulated in a package of plastic resinous material.

Some semiconductor devices of this type have L-shaped terminals of narrow width formed along the bottom and side surfaces of the package. They are generally referred to as leadless type semiconductor devices.

When a semiconductor device of this type is mounted on a circuit board such as a printed circuit board, it is customary to provisionally attach the semiconductor device to the circuit board with adhesive so that those portions of the terminals of the device which are on the bottom surface of the package contact the conductive layer of the circuit board. Then, the circuit board with the semiconductor device thereon is turned upside down so that the device hangs down from the board. Then, the board is dipped in a bath of molten solder so that those portions of the terminals which are on the side surface of the package (and which extend continuously to those portions of the terminals which are on the bottom surface of the package) are soldered to the conductive layer of the circuit board.

The synthetic resin usually used as the material of the package, however, has low wettability to solder. When the package, after its top surface is faced downward, is dipped into a bath of molten solder as previously mentioned, the top surface of the package is pressed against the solder and forced into contact with the solder by the surface tension of the solder. However, it often happens that the side surfaces of the package are not wetted with solder so that those portions of the terminals with small area which are on the side surface of the package cannot be soldered to the conductive layer of the circuit board. This is particularly true with small-sized packages having, for example, a width of 2 to 3 mm and a height of 1 to 2 mm.

Accordingly, the primary object of the invention is to provide a semiconductor device having a package of plastic resinous material in which the terminals formed along the side surface of the package are securely soldered to the conductive layer of a printed circuit board.

Another object of the invention is to provide a semiconductor device having terminals on the side surfaces of the package which are so shaped as to improve the incomplete contact between the terminals and solder caused by the low wettability to solder of the package made of synthetic resin.

SUMMARY OF THE INVENTION

In accordance with the invention, the terminals extending from the bottom surface to the side surface of the package are so arranged as to extend substantially to the top and/or the end surfaces of the package.

Even if terminals are provided so as to extend from the bottom surface to both the side surfaces of the package, they may be so arranged as to extend substantially to the top and/or the end surfaces of the package.

As previously mentioned, when a package is immersed in a bath of molten solder with the top surface thereof facing downwardly, the top surface is forced into direct contact with the solder. Although all the area of the side surfaces of the package is not in contact with the solder, the portion of the side surfaces thereof adjacent to the top surface comes into contact with the solder as the package is immersed deeper and deeper into the solder.

In this manner as the top surface or the side surfaces of the package are contacted by solder, the portions of the terminals which are near the top surface or the end surfaces come into contact with the solder.

Since the terminals are usually made of metal, they are easily wetted with solder so that once the solder contacts a portion of the terminals, it creeps over the whole area of the terminals, thereby ensuring that the terminals of the package are securely soldered to the conductive layer of the printed circuit board.

The invention will be described in detail with reference to the accompanying drawings.

DESCRIPTION OF PREFERRED EMBODIMENTS

Figure 1:
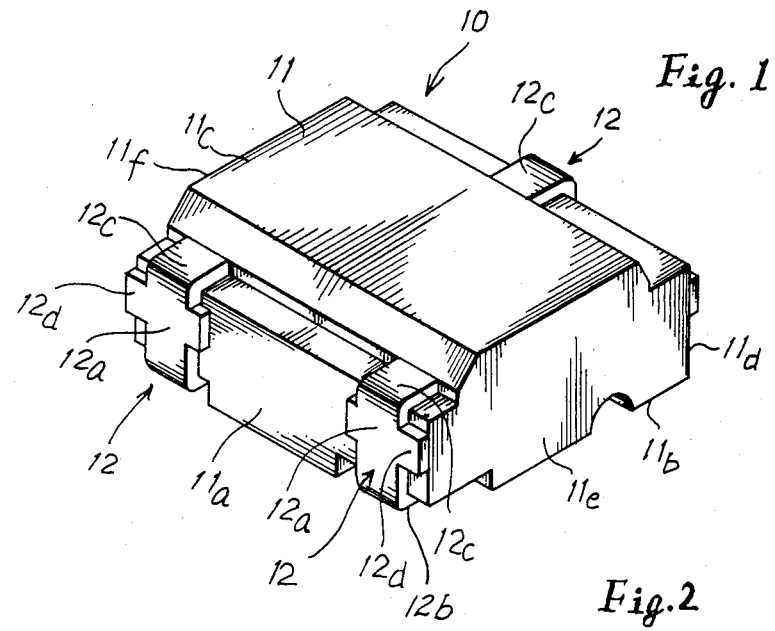
FIG. 1 is a perspective view of a semiconductor device embodying the invention.

Referring to FIG. 1, there is shown a semiconductor device 10 comprising a package made of synthetic resin 11 which encapsulates a semiconductor element such as a transistor chip, a diode chip, an IC chip and so on. In the illustrated embodiment, the device 10 encapsulates a transistor chip and has three terminals 12 coming out from the emitter, collector and base of the transistor chip.

Each of the two terminals 12 on the side surface 11a of the package 11 is comprised of a portion 12a on the side surface 11a, a portion 12b extending from the portion 12a over the bottom surface 11b of the package and a portion 12c extending as far as adjacent to or, as illustrated in the drawings, over the top surface 11c.

In a similar manner, the terminal on the other side surface 11d of the package (opposite to the side surface 11a) comprises three portions 12a, 12b and 12c.

For immersion in a bath of molten solder, the bottom surface 11b of the device 10 is provisionally attached by adhesive to a printed circuit board 1 so that the terminal portions 12b are in direct contact with a conductive layer 2 on the board 1. Then the board 1 with the device thereon is turned upside down and with the top surface 11c of the package 11 facing downward, the package is immersed in a bath of molten solder 5 in a known manner.

Figure 2:
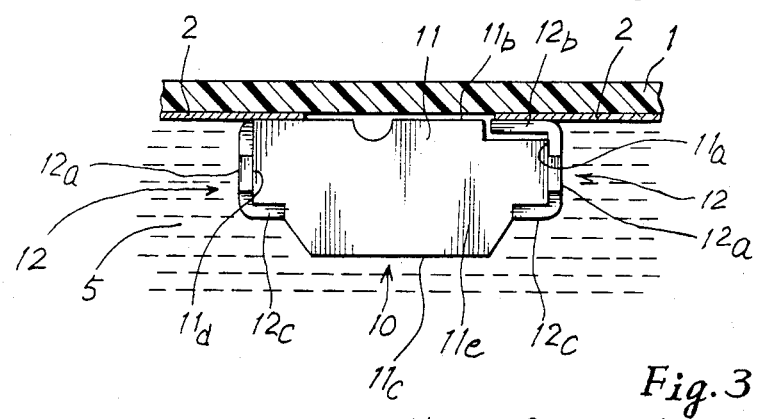
FIG. 2 is an end view of the device of FIG. 1 immersed in a bath of molten solder.

When the package 11 is dipped in the solder bath in the abovementioned manner, the top surface 11c now facing downward is pressed against the solder 5 and the terminal portion 12c is also pressed against the solder and forced into direct contact with the solder 5. Since the terminal 12 is made of metal, it is easily wetted with solder so that the solder easily flows from the terminal portion 12c to the terminal portion 12a to cover the whole area of the two portions as shown in FIG. 2.

Without the terminal portion 12c, the low wettability of the resin of the package would cause a void to be formed between the side surfaces 11a, 11d and the solder thereby preventing the solder from coming into direct contact with the terminal portion 12a.

Figure 3:
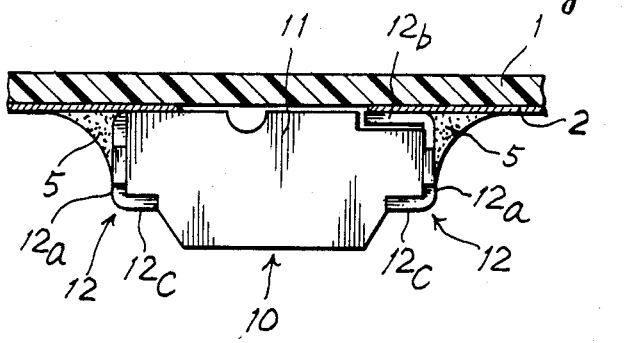
FIG. 3 is an end view of the device soldered to a base plate.

FIG. 3 shows the semiconductor device of the invention with the terminal portion 12a having been securely adhered by solder to the conductive layer 2 of the board 1. Thus, the semiconductor device is mechanically securely mounted on the printed circuit board 1 and electrically connected to the conductive layer 2 thereon.

In FIG. 1, the terminal portion 12c extends over the top surface 11c of the package. The terminals 12 may extend only adjacent to the top surface 11c, provided that they extend to the upper portion of the side surface of the package which can be contacted by solder when the package is dipped in the solder bath.

Figure 4:
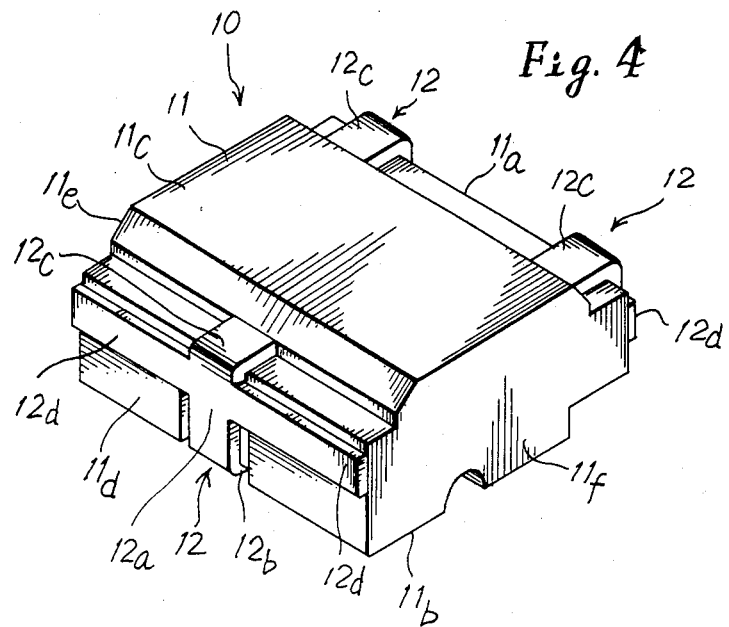
FIG. 4 is a perspective view of the device of FIG. 1 as viewed from the rear side thereof.

The terminal portion 12a may be formed with branches 12d laterally extending near the end surfaces 11e, 11f of the package. With this arrangement, when the package is dipped into a solder bath, the solder contacts the portions of the end surfaces 11e, 11f adjacent to the top surface 11a now facing downward. FIG. 4 shows the device as viewed from the opposite side to that shown in FIG. 1.

Figure 5:
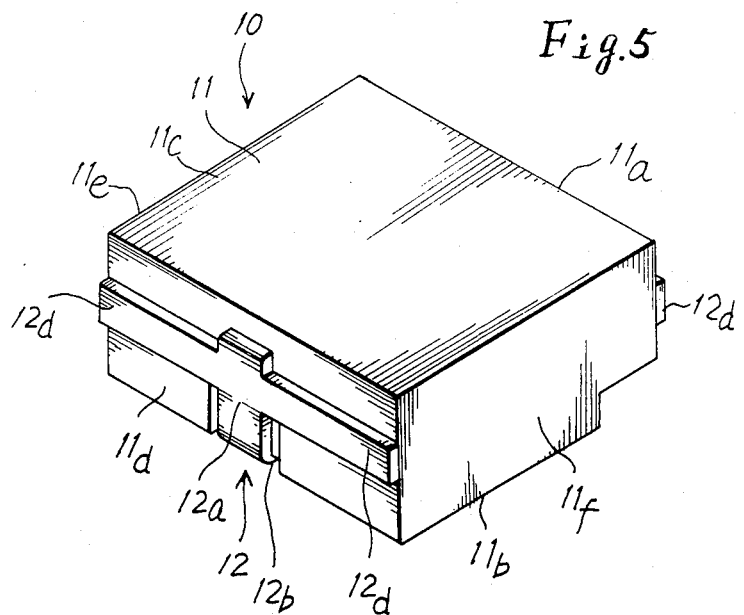
FIG. 5 is a perspective view of another embodiment of the invention.
Figure 6:
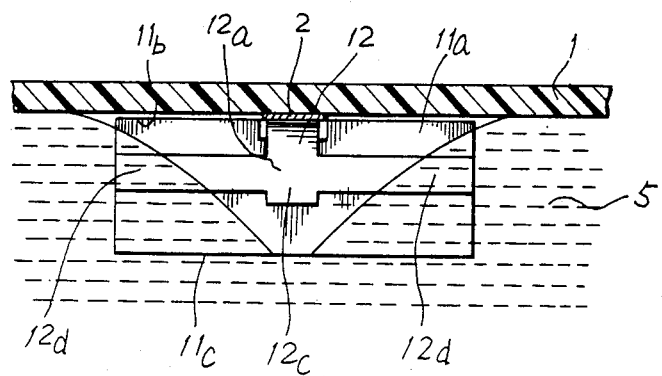
FIG. 6 is a side view of the device of FIG. 5 immersed in a bath of molten solder.

FIG. 5 shows another embodiment of the invention, wherein each terminal portion on the side surface 11a, 11d of the package is formed at the upper portion thereof with a pair of branches 12d extending laterally in opposite directions to a point adjacent the end surfaces 11e, 11f of the package. The terminal 12, however, has no such portion as 12c in the previous embodiment. FIG. 6 shows the device of FIG. 5 dipped in a molten solder bath.

Even if the terminal portion 12a is at the middle part of the side surface 11a of the package, the branches 12d extending laterally in opposite directions can be forced into direct contact with the solder 5, which flows from the outer ends of the branches 12d toward the central portion 12a to cover the whole area of the terminal 12. This ensures a secure bond between the terminals 12 of the semiconductor device and the conductive layer 2 of the printed circuit board.

In accordance with the invention, a secure bond between the terminals of a semiconductor device and a printed or other circuit board can be effected by merely changing the shape of the terminals.

What I claim is:

1. A semiconductor device, comprising:
    a package of plastic resinous material, said package having a first surface for abutment with a circuit board, a second surface spaced away from said first surface, said second surface including a first central portion flanked by first and second edge portions, said edge portions spaced from said first surface a lesser distance than said central portion, said second surface further including slanted portions connecting said first and second edge portions to said central portion such that said second surface has a mesa-shaped topography, said package further including side surfaces spaced apart from one another and abutting said first surface and said edge portions of said second surface, and end surfaces spaced apart from one another and abutting said first and second surfaces and abutting said side surfaces;
    a semiconductor element encapsulated in said package; and
    a terminal of said semiconductor element, said terminal including a first portion on one of said side surfaces of said package, said first portion extending to said second surface of said package, said terminal further including a second portion on said one of said side surfaces, said second portion extending from said first portion to both of said end surfaces of said package.

2. The semiconductor device of claim 1, wherein said terminal includes a third portion that extends from said first portion to a point on said second surface of said package.

3. The semiconductor device of claim 1, wherein said first portion extends to a point on said first surface of said package.

4. A semiconductor device, comprising:
    a package of plastic resinous material, said package having a first surface for abutment with a circuit board, a second surface spaced away from said first surface, side surfaces spaced apart from one another and abutting said first and second surfaces, and end surfaces spaced apart from one another and abutting said first and second surfaces and abutting said side surfaces;
    a semiconductor element encapsulated in said package;
    a first terminal of said semiconductor element, said terminal including a first portion centrally located on one of said side surfaces of said package, said first portion extending to both of said end surfaces of said package; and,
    second and third terminals of said semiconductor element, each of said second and third terminals including a first portion on said other of said side surfaces, the first portion of said second terminal extending to one of said end surfaces and the first portion of said third terminal extending to the other of said end surfaces.

5. The semiconductor device of claim 4, wherein said first portion extends to said first surface of said package.

* * * * *